(12) United States Patent
Okushima

(10) Patent No.: US 7,538,995 B2
(45) Date of Patent: May 26, 2009

(54) SEMICONDUCTOR INTEGRATED CIRCUIT DEVICE

(75) Inventor: Mototsugu Okushima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 439 days.

(21) Appl. No.: 11/003,339

(22) Filed: Dec. 6, 2004

(65) Prior Publication Data

US 2005/0122646 A1 Jun. 9, 2005

(30) Foreign Application Priority Data

Dec. 4, 2003 (JP) .............................. 2003-405468

(51) Int. Cl.
*H02H 3/22* (2006.01)
(52) U.S. Cl. ........................................ 361/56; 361/111
(58) Field of Classification Search .............. 361/56–58, 361/91.1, 111; 257/355–360; 326/30, 82, 326/87; 327/112
See application file for complete search history.

(56) References Cited

U.S. PATENT DOCUMENTS

| | | | | |
|---|---|---|---|---|
| 5,767,695 A | * | 6/1998 | Takekuma et al. ............ | 326/30 |
| 5,969,929 A | * | 10/1999 | Kleveland et al. ........... | 361/111 |
| 6,021,071 A | | 2/2000 | Otsuka .................. | 365/189.05 |
| 6,091,595 A | * | 7/2000 | Sharpe-Geisler ............ | 361/111 |
| 6,326,821 B1 | * | 12/2001 | Gabara ....................... | 327/112 |
| 6,586,964 B1 | | 7/2003 | Kent et al. | |
| 6,815,980 B2 | * | 11/2004 | Kerr ............................ | 326/30 |
| 7,068,065 B1 | * | 6/2006 | Nasrullah .................... | 326/30 |
| 2002/0114146 A1 | | 8/2002 | Bergman et al. | |

FOREIGN PATENT DOCUMENTS

| | | |
|---|---|---|
| EP | 0 780 851 | 6/1997 |
| JP | 5-166361 | 7/1993 |
| JP | 7-221272 | 8/1995 |
| JP | 2000-31811 | 1/2000 |
| JP | 2001-110995 | 4/2001 |
| JP | 2004-327602 | 11/2004 |
| WO | 01/54273 | 7/2001 |

OTHER PUBLICATIONS

European Search Report—Feb. 20, 2009—EP 04 02 8349.

* cited by examiner

*Primary Examiner*—Danny Nguyen
(74) *Attorney, Agent, or Firm*—Young & Thompson

(57) ABSTRACT

A semiconductor IC device includes an electrostatic protective circuit connected to an internal circuit connected between two pads. The internal circuit includes a matching circuit for adjusting the impedance between the two pads. The matching circuit includes n (n is a positive number of 2 or more) resistance elements connected in parallel between the two pads; n×m (m is a positive number of 2 or more) transistors, each m transistors connected in parallel being connected in series to the n resistance elements, respectively; and an adjustor for selectively allowing the transistors to perform an ON-operation. The resistance of each resistance element is set to a larger value than the impedance to be adjusted. Accordingly, a surge-current control effect is enhanced and breakdown of the transistors can be prevented.

5 Claims, 7 Drawing Sheets

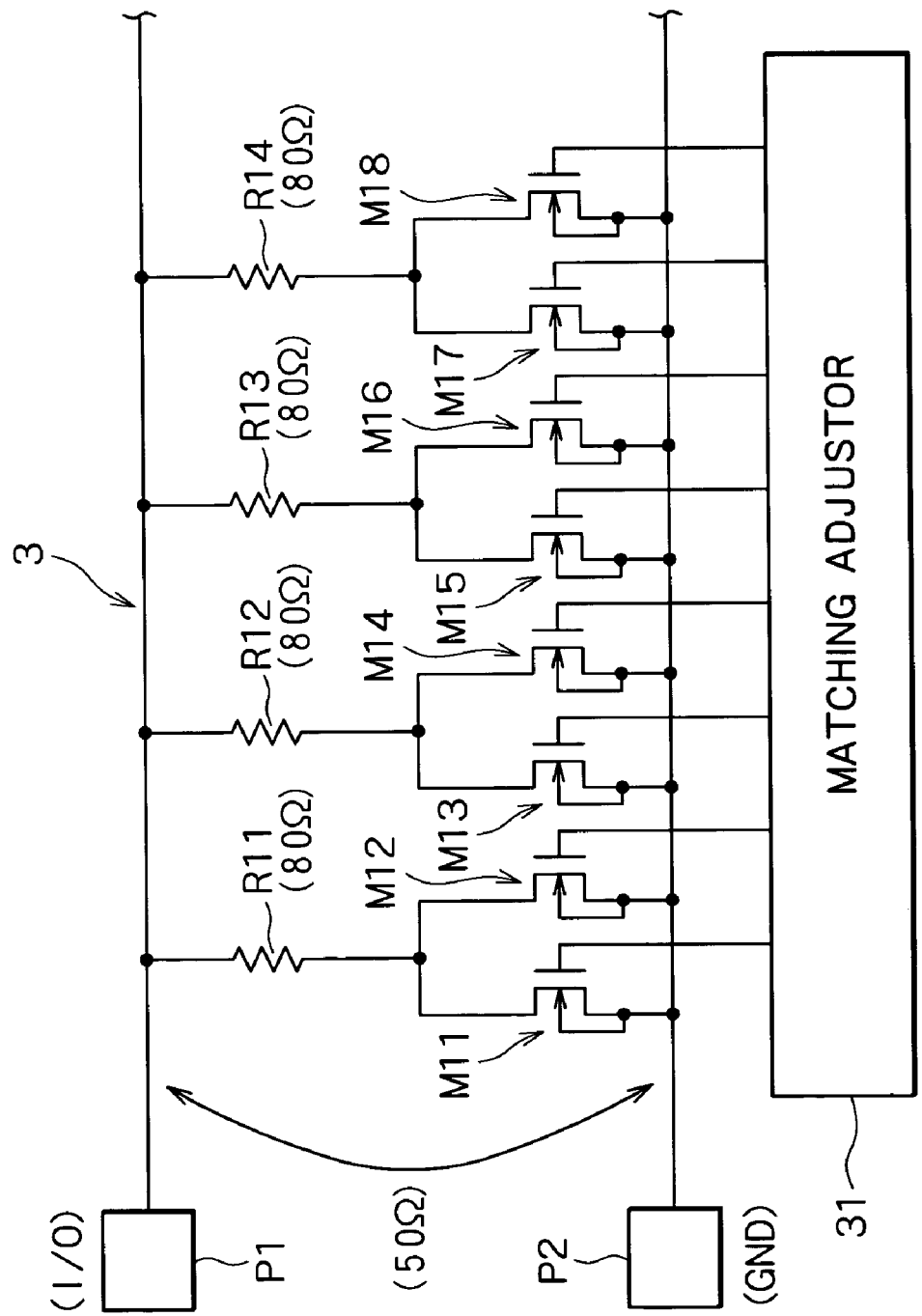

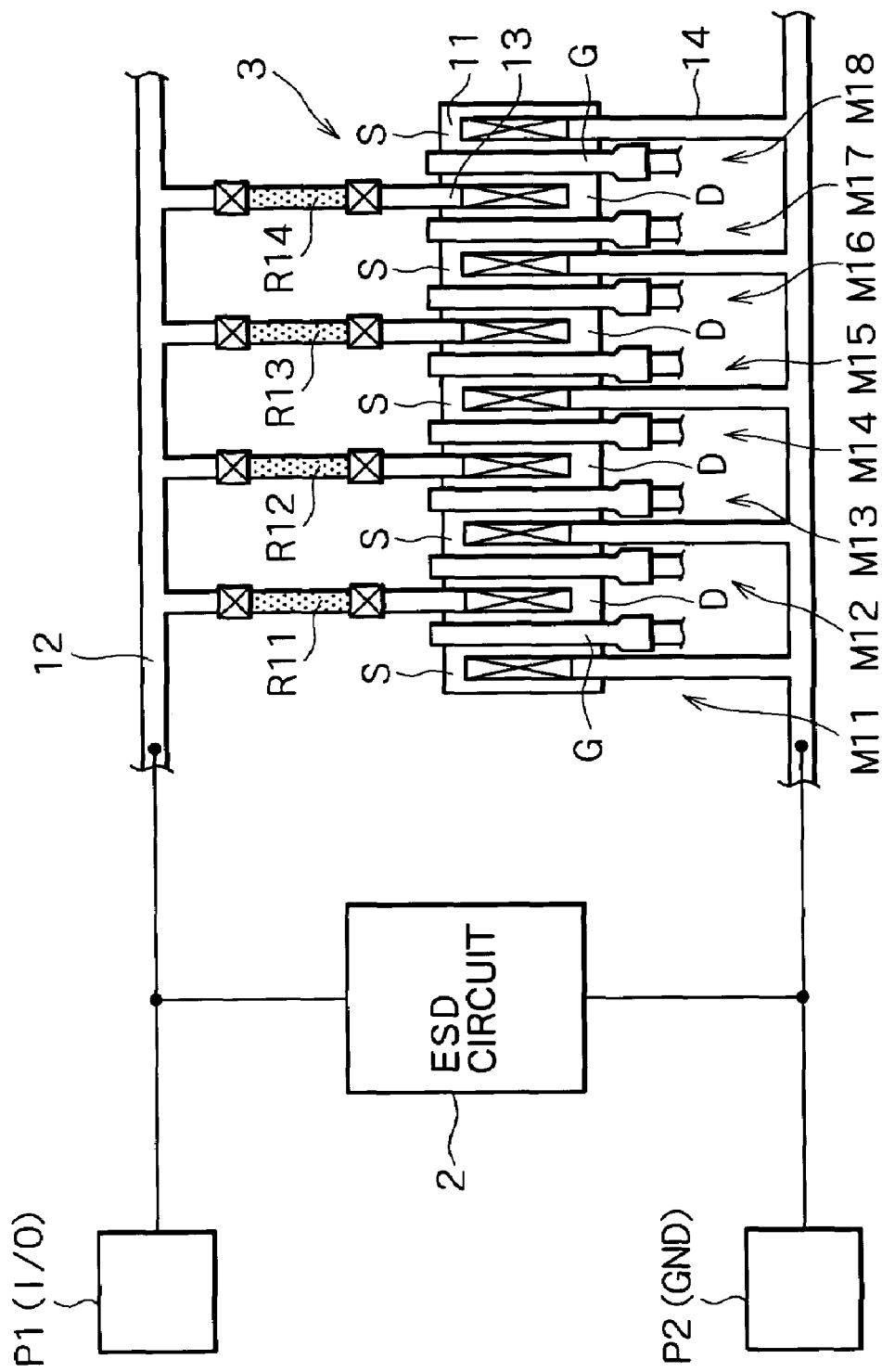

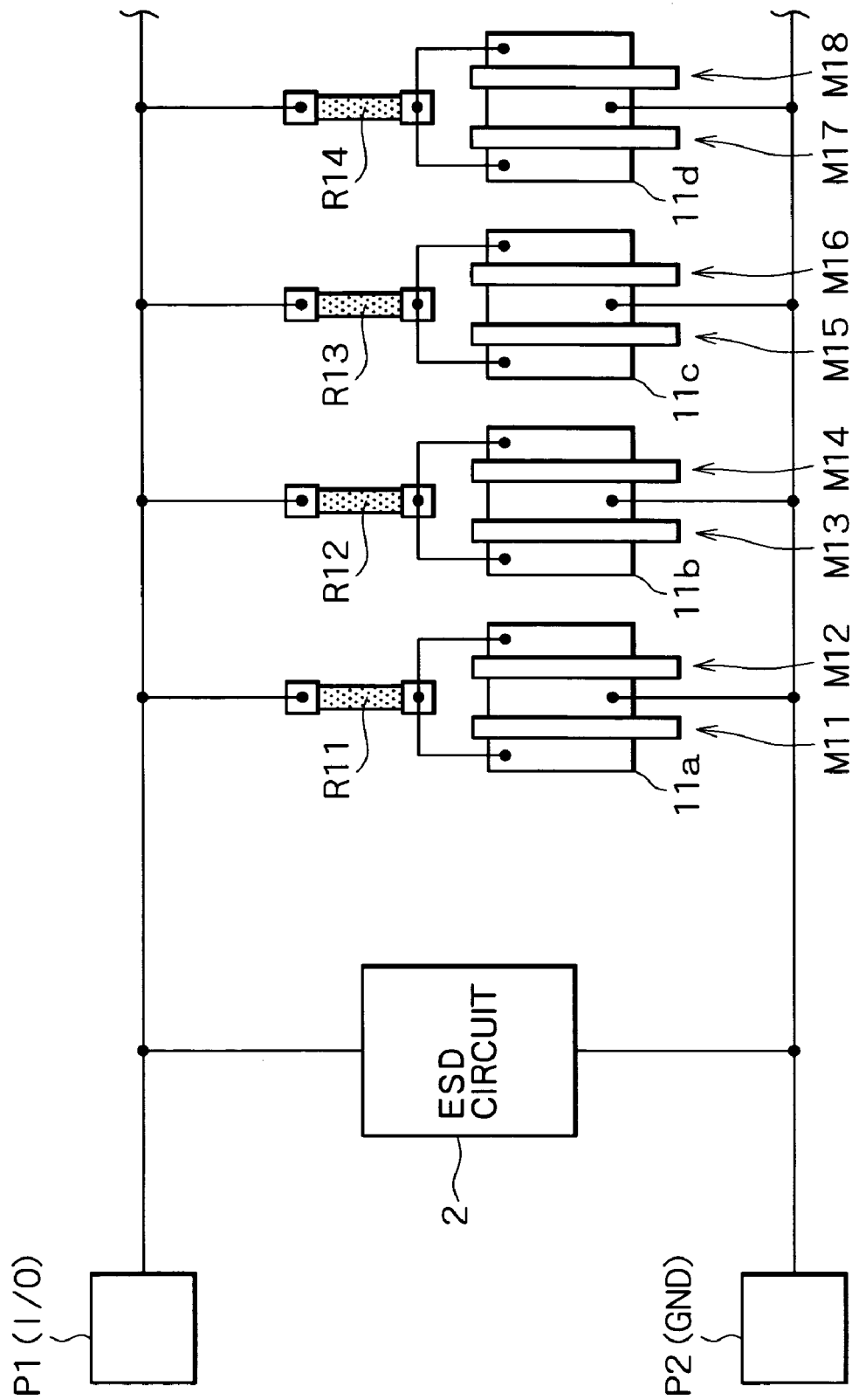

SEMICONDUCTOR INTEGRATED CIRCUIT DEVICE

BACKGROUND OF THE INVENTION

1. Field of the Invention

The present invention relates to a semiconductor integrated circuit (IC) device, in particular, to a semiconductor IC device configured so that electrostatic breakdown of a transistor placed in the input/output side of an internal circuit is prevented.

2. Description of the Related Art

In a semiconductor IC device, as shown in FIG. 1, in order to prevent electrostatic discharge (ESD) breakdown in an internal circuit 1 caused by static electricity applied between two pads P1 and P2 including a power-supply pad and a signal input/output pad, an ESD circuit 2 is provided in series or parallel with a circuit for connecting the internal circuit 1 and the two pads P1 and P2. The ESD circuit 2 dissipates an ESD surge current (hereinafter referred to as a surge current) from a high-potential pad (for example, a signal input/output pad (I/O pad)) P1 to a low-potential pad (for example, a ground pad (GND pad)) P2. The ESD circuit 2 includes semiconductor devices such as a MOS transistor, a diode, and a thyristor. In particular, in an ESD circuit including a resistor (ballast resistor) and a MOS transistor connected in series, as disclosed in Japanese Unexamined Patent Application Publication No. 2001-110995, snap-back of a parasitic bipolar transistor caused when a surge current is applied allows the surge current to be dissipated to the GND and also allows a voltage input to the internal circuit to drop to the snap-back voltage, so that ESD breakdown of the MOS transistor of the internal circuit can be prevented. At this time, if the surge current exceeds the current at snap-back, part of the surge current flows into the internal circuit.

On the other hand, as shown in FIG. 1, the internal circuit of a semiconductor IC device often includes a matching circuit 3 for matching the impedance between the two pads P1 and P2. In many cases, the matching circuit 3 includes resistance elements of minor variations and variable resistance elements whose resistance can be finely adjusted, so as to enhance the matching accuracy. As the variable resistance elements, MOS transistors using the resistance at an ON-operation may be used. FIG. 2 shows an example of this type of conventional matching circuit. In this circuit, a resistance element R2 is connected in series to a plurality of (8 in this example) MOS transistors M31 to M38 (the sources and drains thereof are connected in parallel), and a matching adjustor 31 for selectively allowing the MOS transistors M31 to M38 to perform an ON-operation is connected. In the matching circuit including the resistance element R2 and the eight MOS transistors M31 to M38, the entire resistance, that is, the impedance of the circuit can be adjusted by connecting in series ON-resistance of at least one of the MOS transistors M31 to M38 in an ON-state to the resistance element R2. By using MOS transistors of a small gate width as the MOS transistors M31 to M38, the ON-resistance of each MOS transistor can be increased. Accordingly, the adjustment range of the impedance decreases and thus the matching accuracy can be enhanced.

For example, in the matching circuit shown in FIG. 2, a 20-Ω-resistor is used as the resistance element R2 and the MOS transistors M31 to M38 are selectively allowed to perform an ON-operation. With this arrangement, parallel-connection resistance of ON-resistance (each of which is 240 Ω) of the eight MOS transistors M31 to M38 is adjusted to 30 Ω, so that an impedance matching of 50 Ω is realized. The resistance of the resistance element R2 must be lower than the matching impedance. By decreasing the ON-resistance of the MOS transistors M31 to M38 while increasing the resistance of the resistance element R2 as much as possible, the gate width of the MOS transistors M31 to M38 increases and they occupy a very large area, which is disadvantageous for realizing a highly integrated semiconductor IC device. Therefore, in the circuit shown in FIG. 2, the resistance of the resistance element R2 is set to a smaller value and the ON-resistance of the MOS transistors M31 to M38 is set to a larger value, so as to minimize the area of the MOS transistors and to promote high integration. If the matching circuit includes only resistance elements, current consumption increases because a current constantly flows through the resistance elements. Whereas, if just the ON-resistance of the MOS transistors is used for the matching circuit, it is difficult to obtain a highly accurate impedance due to manufacture variations of the MOS transistors.

In a case where the ESD circuit disclosed in Japanese Unexamined Patent Application Publication No. 2001-110995 is connected to the above-described matching circuit, if a surge current which cannot be dissipated in the ESD circuit is applied to the matching circuit, the surge current is applied to each of the MOS transistors M31 to M38 without sufficiently being controlled by the resistance element R2 because the resistance of the resistance element R2 is 20 Ω, which is lower than the matching impedance of 50 Ω. Further, since the gate width of each of the MOS transistors M31 to M38 is small, as described above, any one of the MOS transistors performs a parasitic bipolar operation alone and the MOS transistor cannot stand a current flowing thereto. Accordingly, the MOS transistor breaks down earlier than a MOS transistor of the ESD circuit. This is because a plurality of MOS transistors in the matching circuit are not likely to perform a parasitic bipolar operation at the same time due to variations of manufacturing conditions, although the plurality of MOS transistors used in the matching circuit are manufactured under the same standard. As a result, this type of matching circuit cannot be protected by the ESD circuit, and thus the semiconductor integrated circuit including the matching circuit is broken down.

SUMMARY OF THE INVENTION

An object of the present invention is to provide a semiconductor IC device for reliably preventing ESD breakdown in a matching circuit including resistance elements and transistors.

The present invention provides a semiconductor IC device in which an electrostatic protective circuit is connected to an internal circuit connected between two pads including a power-supply pad and a signal input/output pad. The internal circuit includes a matching circuit for adjusting the impedance between the two pads. The matching circuit includes n (n is a positive number of 2 or more) resistance elements connected in parallel between the two pads; n×m (m is a positive number of 2 or more) transistors, each m transistors connected in parallel being connected in series to the n resistance elements, respectively; and an adjustor for selectively allowing the transistors to perform an ON-operation. The resistance of each resistance element is set to a larger value than the impedance required between the input/output pads. The adjustor selectively allows at least one of the n×m transistors to perform an ON-operation according to the impedance between the two pads.

In the semiconductor IC device of the present invention, the matching circuit includes the n resistance elements connected in parallel between the two pads, and the resistance of each resistance element is set to a lager value than the impedance. With this configuration, a surge current is controlled by a voltage drop at this high resistance and breakdown of each transistor can be prevented. Also, by providing a resistance element for a group of transistors, the number of resistance elements can be minimized. Further, by setting the resistance of the plurality of transistors to a large value, the layout area of the transistors can be minimized, which is advantageous for realizing high integration.

The present invention provides another semiconductor IC device which adjusts an impedance between pads. Said semiconductor IC device comprises plural sets of resistance elements and transistors, which are provided between two pads and each of which has a resistor element and a transistor connected in series. The transistors are selectively turned on, with at least two of the transistors being turned on simultaneously.

BRIEF DESCRIPTION OF THE DRAWINGS

FIG. 4 is a circuit diagram showing a matching circuit of a first embodiment of the present invention;

FIG. 5 shows the layout of the matching circuit and an ESD circuit of the first embodiment of the present invention;

FIG. 6 shows the layout of a matching circuit of a second embodiment of the present invention.

DETAILED DESCRIPTION OF THE PREFERRED EMBODIMENTS

According to a semiconductor integrated circuit (IC) device of a preferred embodiment of the present invention, a MOS transistor is used as a transistor and the source and drain thereof are connected in series to a resistance element. M MOS transistors are connected to each of n resistance elements, and preferably, these n×m MOS transistors are laid out in the same diffused-layer region. Alternatively, n groups of transistors composed of each m MOS transistors, which are connected to the n resistance elements respectively, may be laid out in different diffusion-layer regions. In addition, the resistances of all the n resistance elements should be the same, and all the m MOS transistors should have the same layout size.

Under these conditions, if each of the m MOS transistors has the same gate width, the gate width should satisfy the following equations (1), (1'), (2'), and (3).

$$Wx \times Idg \times Rt + Vsp > Vesd \quad (1)$$

$$Wx = W1 \times N \quad (1')$$

$$m \times W1 \times Idg \times Rt + Vsp > Vesd \quad (2')$$

$$Wx \times Rt > Wesd \times Resd \quad (3)$$

Herein,

Wx: total gate width of MOS transistors performing a bipolar operation together when a surge current is applied;

W1: gate width of each MOS transistor;

N: the number of MOS transistors performing a bipolar operation ($1 \leq N \leq m$);

Idg: value of breakdown current for the gate width of each MOS transistor;

Rt: electrical resistance of MOS transistor (total resistance in a path from a source pad to a drain pad of the MOS transistor);

Vsp: snap-back voltage in the MOS transistor performing a bipolar operation;

Vesd: maximum voltage required by an electrostatic protective circuit for dissipating a surge current;

Wesd: gate width of a MOS transistor in the electrostatic protective circuit (total gate width if a plurality of MOS transistors connected in parallel are connected to a ballast resistor); and Resd: resistance of the ballast resistor of electrostatic protective circuit.

Figure 1:
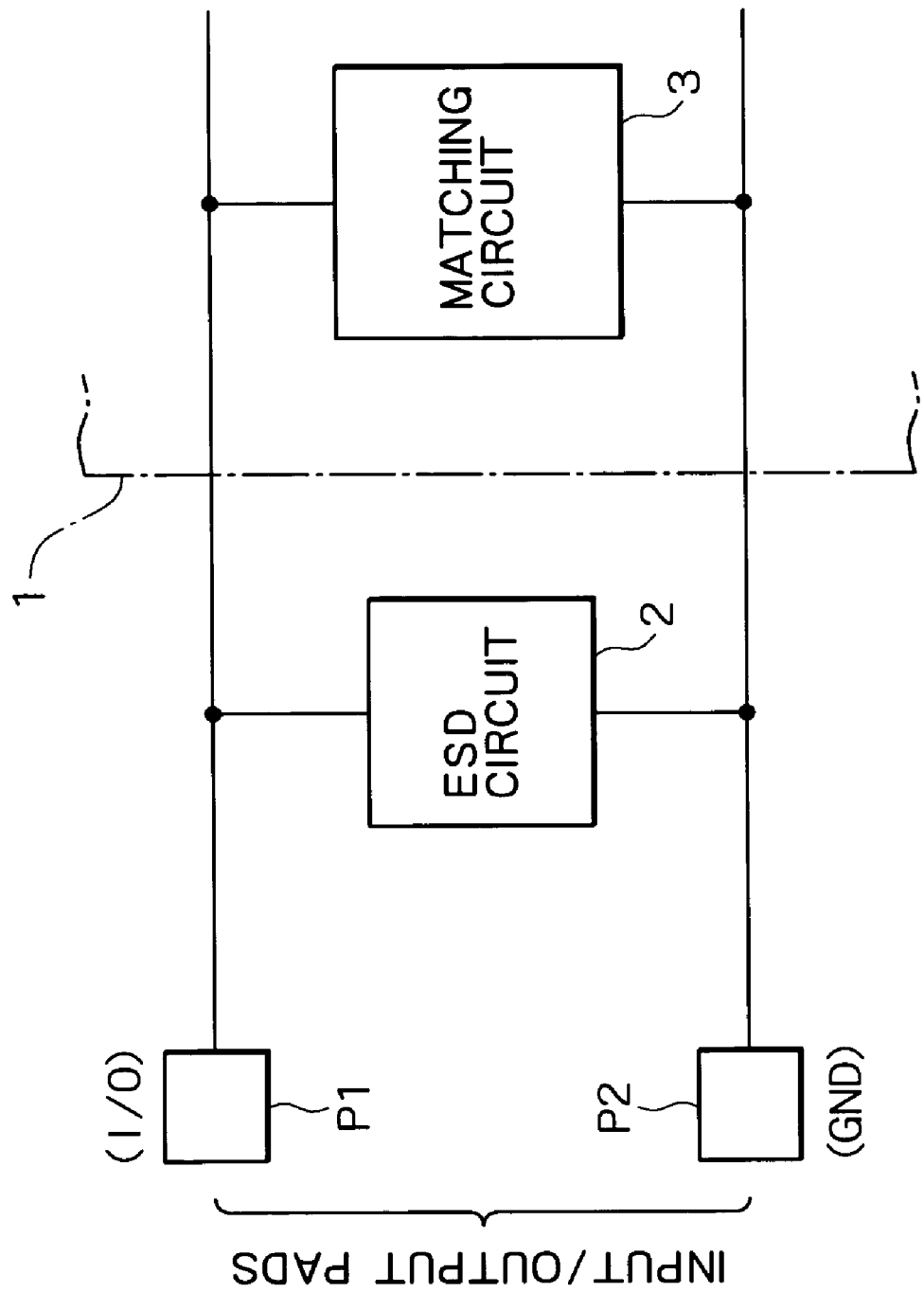
FIG. 1 is a block diagram of a semiconductor integrated circuit to which a matching circuit of the present invention and a conventional matching circuit are applied.

Hereinafter, a semiconductor IC device of embodiments of the present invention will be specifically described with reference to the attached drawings. FIG. 1 is a block diagram showing a part of a semiconductor integrated circuit to which the present invention is applied. In this embodiment, an electrostatic discharge (ESD) circuit 2 is connected in parallel to an internal circuit 1, which is connected to a signal input/output pad (I/O pad) P1 and a ground pad (GND pad) P2. In the semiconductor IC device according to the present invention, input/output pads serve for receiving a surge current and may be formed by a power-supply pad and a pad for inputting/outputting various signals, instead of the I/O pad and the GND pad. A matching circuit 3 which is provided at the internal circuit 1 realizes impedance matching between an external circuit (not shown) connected between the two pads P1 and P2 and the internal circuit 1.

Figure 3A:
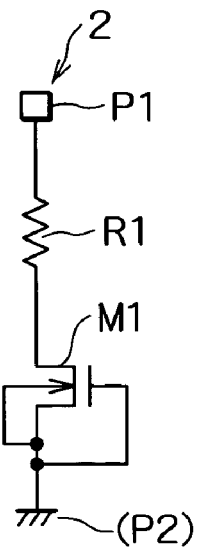
FIG. 3A is a circuit diagram of an ESD circuit.

As shown in FIG. 3A, for example, a ballast resistor R1 and a MOS transistor M1 are connected in series in the ESD circuit 2. Alternatively, as disclosed in Japanese Unexamined Patent Application Publication No. 2001-110995, the ESD circuit 2 may include a plurality of MOS transistors in which the drains thereof are connected to the two pads and the sources are selectively shared. Also, various semiconductor devices, such as a bipolar transistor and a diode, may be used. In the first embodiment, as shown in the cross-sectional view in FIG. 3B, the N-type MOS transistor M1 includes a gate G, and a source S, a drain D, and a channel stopper CS having an N-type impurity diffusion layer formed in a P-type well W. The ballast resistor R1 is connected to the drain D of the MOS transistor M1 and to the I/O pad P1. The source S of the MOS transistor M1 is grounded, that is, connected to the GND pad P2.

Figure 3C:
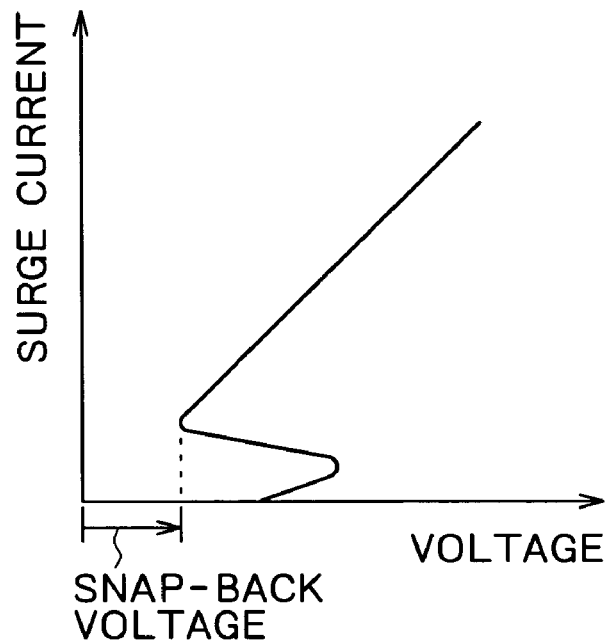
FIG. 3C shows the relationship between a surge current and a surge voltage.
Figure 3B:
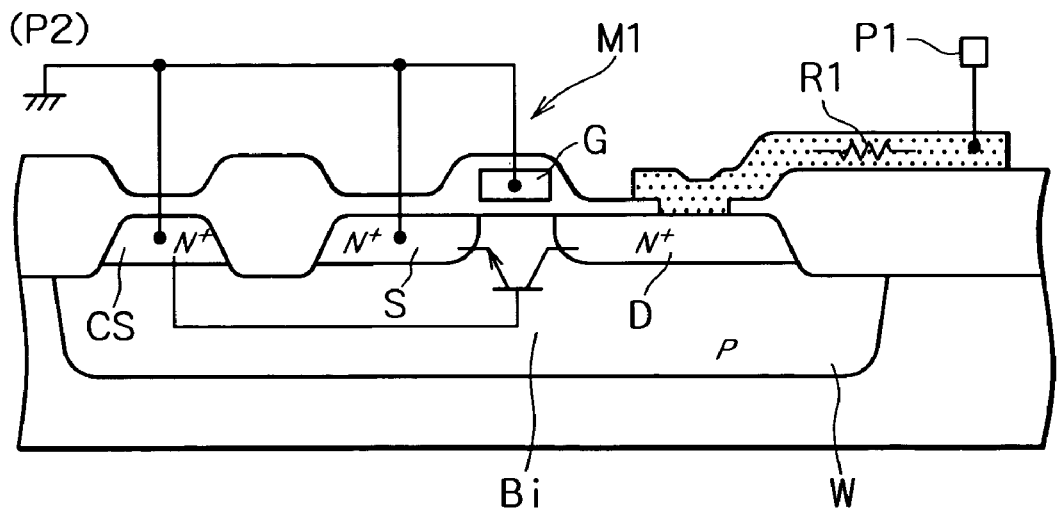
FIG. 3B is a cross-sectional view of the ESD circuit.

Referring to FIG. 3C, which illustrates the relationship between a surge current and a drain voltage, when a surge current applied between the two pads P1 and P2 increases so as to reach a predetermined voltage, avalanche breakdown due to reverse bias occurs at a PN junction between the drain D and the P-type well W, so that a breakdown current flows. When the surge current further increases so as to reach a voltage Vt, the PN junction between the source S and the P-type well W is forward-biased, so that a parasitic bipolar transistor B1 is turned ON. This allows a snap-back current to flow from the drain D to the source S, and thus the drain voltage drops and snap-back occurs. In this way, drop of the drain voltage caused by the snap-back suppresses a surge current applied to the internal circuit 1, and thus the internal circuit 1 can be protected.

FIG. 4 is a circuit diagram showing the matching circuit 3. As shown in FIG. 1, the matching circuit 3 is provided at the input/output side of the internal circuit 1, which is connected between the two pads P1 and P2 connected to the ESD circuit 2. The matching circuit 3 includes n (n is an integer of 2 or more) resistance elements R11 to R14, one end thereof being connected to the I/O pad P1, and m (m is an integer of 2 or more) N-type MOS transistors connected in parallel each other are connected in series to the other end of each of the resistance elements R11 to R14. That is, m×n N-type MOS transistors M11 to M18 are provided in the matching circuit 3. In the first embodiment, the values of n and m are set to 4 and 2, respectively. The eight (4×2) MOS transistors M11 to M18 are formed under the same manufacturing standard. In particular, the gate width is the same in all the MOS transistors in order to realize a simple design, as will be described later. In the MOS transistors M11 to M18, the drains of each two of them are connected to the resistance elements R11 to R14, respectively, and all the sources thereof are connected to the GND pad P2. The gates are connected to a matching adjustor 31. A required signal is selectively input to the gates of the MOS transistors M11 to M18 according to the control by the matching adjustor 31, so that the selected MOS transistors perform an ON-operation.

FIG. 5 is a plan view showing the layout in the matching circuit 3. Eight (=m×n=4×2) gates G are placed in parallel in an element region (diffusion-layer region) 11, which is isolated by an element isolation region of a semiconductor substrate included in the semiconductor IC device. Also, an N-type impurity diffusion layer is disposed in the element region sandwiching each gate G so that sources S and drains D are provided. Accordingly, in the eight MOS transistors M11 to M18, adjoining MOS transistors share a common source S or drain D. Further, the four (n) resistance elements R11 to R14, which are formed by patterning a high-resistance material, such as polysilicon, are disposed in a region adjacent to the element region 11. One end of each of the resistance elements R11 to R14 is connected to the I/O pad P1 through upper wiring 12. Also, the drains shared by each two adjoining transistors in the eight MOS transistors M11 to M18 are connected to the other ends of the four resistance elements through upper wiring 13, respectively. Further, the source of each of the eight MOS transistors M11 to M18 is connected to the GND pad P2 through upper wiring 14, and each gate G is connected to the matching adjustor 31 through upper wiring (not shown).

With this arrangement, as shown in FIG. 1, the matching circuit 3 is connected in parallel to the ESD circuit 2, which is connected between the I/O pad P1 and the GND pad P2 and which includes the MOS transistor M1.

Figure 2:
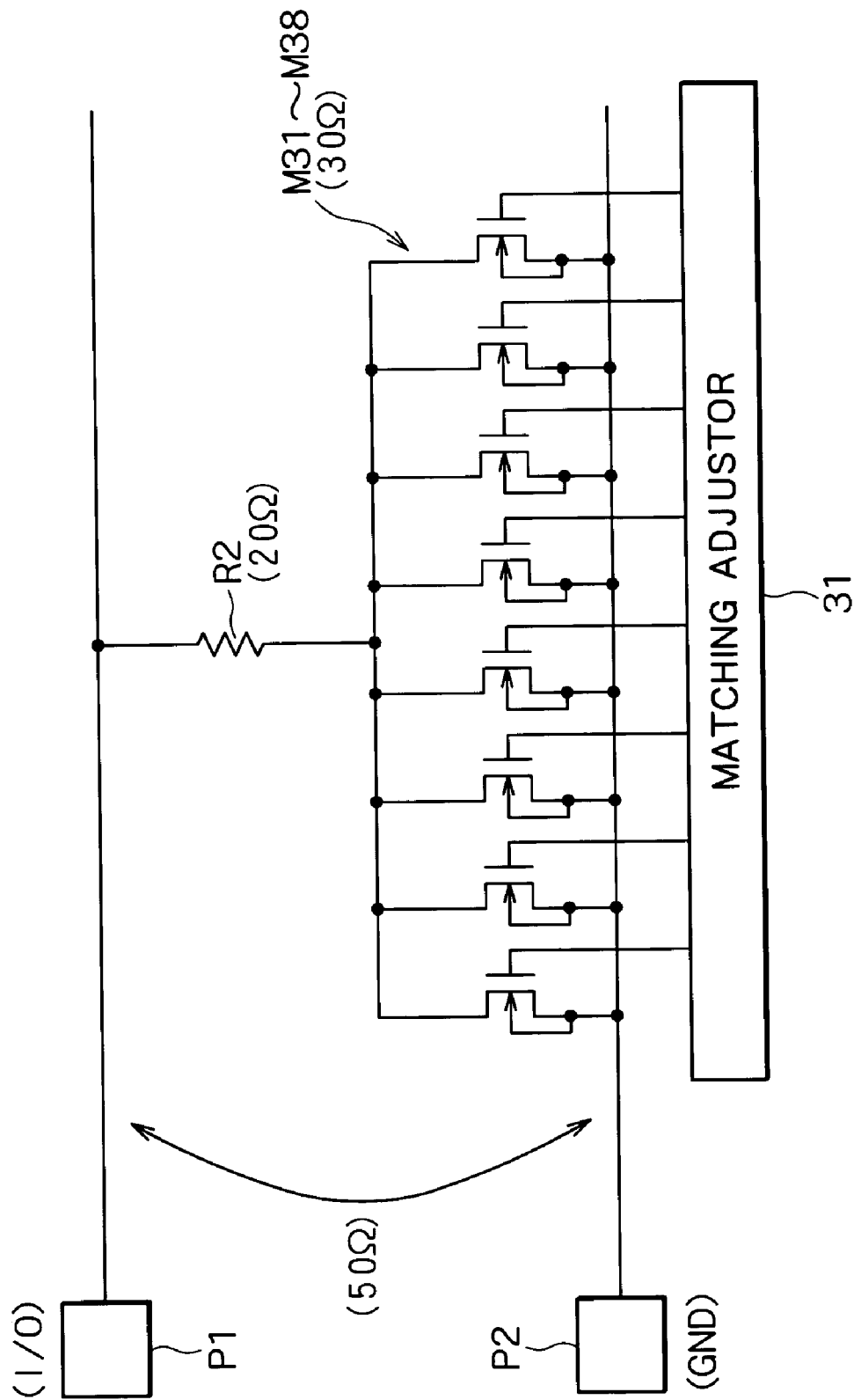
FIG. 2 is a circuit diagram of the conventional matching circuit.

In the first embodiment, as in the prior art shown in FIG. 2, the impedance between the two pads P1 and P2 is adjusted to 50 Ω, the resistance of each of the four resistance elements R11 to R14 is set to 80 Ω, and the ON-resistance of each of the eight MOS transistors M11 to M18 is set to 240 Ω. In this way, although the ON-resistance of each of the MOS transistors M11 to M18 is equal to that of each of the MOS transistors M31 to M38 shown in FIG. 2, the resistance of each of the resistance elements R11 to R14 can be set at four times larger than that of the resistance element R2 shown in FIG. 2.

According to the matching circuit 3, the matching adjustor 31 basically supplies a predetermined potential to the gate of each of the MOS transistors M1 to M18 so as to allow all the eight MOS transistors M11 to M18 to perform an ON-operation. The ON-resistance of each of the MOS transistors M11 to M18 is 240 Ω and two MOS transistors M11 and M12, M13 and M14, M15 and M16, and M17 and M18 are connected in parallel, respectively. Accordingly, each of the parallel connected two MOS transistors has an ON-resistance of 120 Ω and is connected in series to the resistance elements of 80 Ω, respectively. The 80 Ω of each resistance element and the resistance of 120 Ω of the MOS transistors connected in parallel realize the resistance of 200 Ω in a path of each of the resistance elements R11 to R14. Since four resistance elements are connected in parallel, the entire impedance is 50 Ω. At this time, since the ON-resistance of each of the eight MOS transistors M11 to M18 is slightly different from each other due to variations in a manufacturing process, a connection status between each resistance element and the MOS transistors varies by not supplying voltage to the gate of any selected MOS transistor, and the resistance connected to each resistance element also varies. As a result, the entire impedance can be finely adjusted. Also, in the matching circuit 3, since the four resistance elements R11 to R14 are connected in parallel, the resistance of each resistance element can be set to 80 Ω, which is higher than the matching impedance of 50 Ω.

When a surge current is applied between the two pads P1 and P2, a drain voltage drops due to snap-back in the MOS transistor M1 of the ESD circuit 2. However, if the surge current is large, part of the surge current is applied to the matching circuit 3 at the same time. In the matching circuit 3, the four resistance elements R11 to R14 are connected in parallel between the two pads P1 and P2, and the resistance of each of the resistance elements R11 to R14 is set to a larger value than the matching impedance. Therefore, the surge current is controlled by a voltage drop at this high resistance. Accordingly, a high potential is not applied to the MOS transistors M11 to M18 connected to the resistance elements R11 to R14 and breakdown of the MOS transistors M11 to M18 can be prevented. That is, the resistance of the resistance element R2 in the known art shown in FIG. 2 is 20 Ω, which is lower than the matching impedance of 50 Ω, whereas the resistance of each resistance element in the first embodiment is 80 Ω, which is higher than the matching impedance of 50 Ω. As a result, a current control effect quadruples and breakdown of the eight MOS transistors can be effectively prevented.

As a modification of the circuit shown in FIG. 4, a resistance element may be connected in series to each of the eight MOS transistors M11 to M18, and these resistance elements and MOS transistors may be connected in parallel between the two pads P1 and P2. In this case, too, the resistance of each resistance element can be set to a value larger than a predetermined impedance when impedance matching is performed, as in the first embodiment, and a current control effect can be enhanced. In this configuration, however, eight resistance elements corresponding to the eight MOS transistors are required. Since the layout area on a semiconductor substrate of a resistance element is larger than that of a MOS transistor, the integration degree in the semiconductor IC device decreases as the number of resistance elements increases. Therefore, as in the first embodiment, by providing a resistance element for a plurality of MOS transistors, the number of resistance elements can be minimized and the resistance of each resistance element can be set to a large value enough to obtain a current control effect.

As described above, when a surge current is applied to the matching circuit 3, breakdown of the MOS transistors M11 to M18 can be prevented by the current control effect of the resistance elements R11 to R14. However, when a larger surge current is applied, any one of the eight MOS transistors M11 to M18 performs a bipolar operation, that is, a bipolar transistor parasitizes the MOS transistor so as to cause a snap-back, and a further increase in the surge current may cause breakdown of the MOS transistor. In order to prevent the breakdown, the gate width of each of the MOS transistors M11 to M18 is set in the following manner.

That is, the gate width of each of the MOS transistors M11 to M18 is set so that the total voltage of the withstand voltage of MOS transistors performing a bipolar operation in the matching circuit 3 when a surge current is applied and the snap-back voltage of the MOS transistors is larger than a maximum voltage required by the ESD circuit 2 for dissipating the surge current.

For example, when the MOS transistors M11 to M18 have the same gate width as in the first embodiment, the MOS transistors are designed so as to satisfy the following equation (1):

$$Wx \times Idg \times Rt + Vsp > Vesd \quad (1)$$

However $$Wx = W1 \times N \quad (1')$$

Herein,

Wx: total gate width of MOS transistors performing a bipolar operation together when a surge current is applied;

W1: gate width of each MOS transistor;

N: the number of MOS transistors performing a bipolar operation ($1 \leq N \leq m$);

Idg: value of breakdown current for the gate width of each MOS transistor;

Rt: electrical resistance of MOS transistor (total resistance in a path from a source pad to a drain pad of the MOS transistor);

Vsp: snap-back voltage in the MOS transistor performing a bipolar operation; and Vesd: maximum voltage required by the ESD circuit for dissipating a surge current.

By designing the MOS transistors so as to satisfy equation (1), electrostatic breakdown of N MOS transistors can be prevented even if the N MOS transistors perform a parasitic bipolar operation. The above-mentioned Rt strictly represents the entire resistance between one of the input/output pads connected to the source pad of the MOS transistor and the other input/output pad connected to the drain pad. However, Rt may be regarded as the entire resistance between the source pad and the drain pad.

In equation (1), a case where only one of the m MOS transistors performs a bipolar operation is assumed. In that case, N=1 is satisfied and the following equation (2) can be obtained:

$$W1 \times Idg \times Rt + Vsp > Vesd \quad (2)$$

In this case, the gate width of the MOS transistors is maximum. By designing the MOS transistors so as to satisfy equation (2), even if one of the MOS transistors performs a parasitic bipolar operation, electrostatic breakdown of the MOS transistor can be prevented.

On the other hand, assume that all the m MOS transistors perform a bipolar operation. In that case, N=m is satisfied and the following equation (2') can be obtained:

$$m \times W1 \times Idg \times Rt + Vsp > Vesd \quad (2')$$

In this case, the gate width of the MOS transistors is minimum. As is understood by equation (2'), the gate width of the MOS transistors must be larger than that in equation (2'). Therefore, in the present invention, if the number of MOS transistors performing a bipolar operation is represented by m, the MOS transistors may be designed so as to satisfy equation (2').

Since the number of MOS transistors performing a bipolar operation depends on a surge current value and other factors, it is difficult to specify the number. However, the approximate number can be estimated by measuring the current of pulse voltage applied to each MOS transistor in advance. For example, assume that a current of 10 mA is measured when a predetermined pulse is applied to each MOS transistor by using a pulse applying device called a TLP. In that case, if the surge current is 30 mA, it can be estimated that three MOS transistors performed a bipolar operation. In this way, the number N of MOS transistors performing a bipolar operation according to a surge current can be estimated by measuring a current in each MOS transistor of a semiconductor IC device when a pulse voltage is applied thereto, and also an appropriate gate width of each MOS transistor can be found based on equations (2) and (2').

When the ESD circuit includes the ballast resistor R1 and a protective transistor (herein, the MOS transistor M1) connected in series, as shown in FIG. 3A, the MOS transistor is designed so as to satisfy the following equation (3):

$$Wx \times Rt > Wesd \times Resd \quad (3).$$

Herein,

Wesd: gate width of a MOS transistor in the ESD circuit (total gate width if a plurality of MOS transistors connected in parallel are connected to the ballast resistor); and Resd: resistance of the ballast resistor.

By designing the MOS transistor so as to satisfy equation (3), even if x MOS transistors perform a parasitic bipolar operation as in equation (1), electrostatic breakdown of the MOS transistors can be prevented.

Next, a semiconductor IC device according to a second embodiment of the present invention will be described. FIG. 6 shows a layout of a matching circuit according to the second embodiment, a part thereof being simplified. In the second embodiment, each two (m=2) MOS transistors M11 and M12, M13 and M14, M15 and M16, and M17 and M18 connected in parallel are connected to the four resistance elements R11 to R14 and are separately disposed in four element regions (diffusion-layer regions) 11a, 11b, 11c, and 11d isolated by an element isolation region, respectively. Herein, the four element regions 11a to 11d are formed under the same standard. Two gate electrodes extend in each element region, and the gate length and gate width are the same in all the MOS transistors. The four resistance elements R11 to R14 are disposed corresponding to the four element regions 11a to 11d, respectively. One end of each of the four resistance elements R11 to R14 is connected to the I/O pad P1 as in the first embodiment, and the other end thereof is connected to the drains of the MOS transistors M11 to M18 in the four element regions 11a to 11d, respectively. The source of each of the MOS transistors is connected to the GND pad P2.

In the second embodiment, each two MOS transistors connected to the resistance elements R11 to R14 are disposed in the respective element regions 11a to 11d. With this configuration, mutual effect of bipolar operation between MOS transistors in different element regions can be avoided. Further, by providing the MOS transistors separately in the four element regions, the degree of freedom in the layout of the MOS transistors M11 to M18 and the resistance elements R11 to R14 can be increased, which results in simplification of design and high integration.

Figure 7:
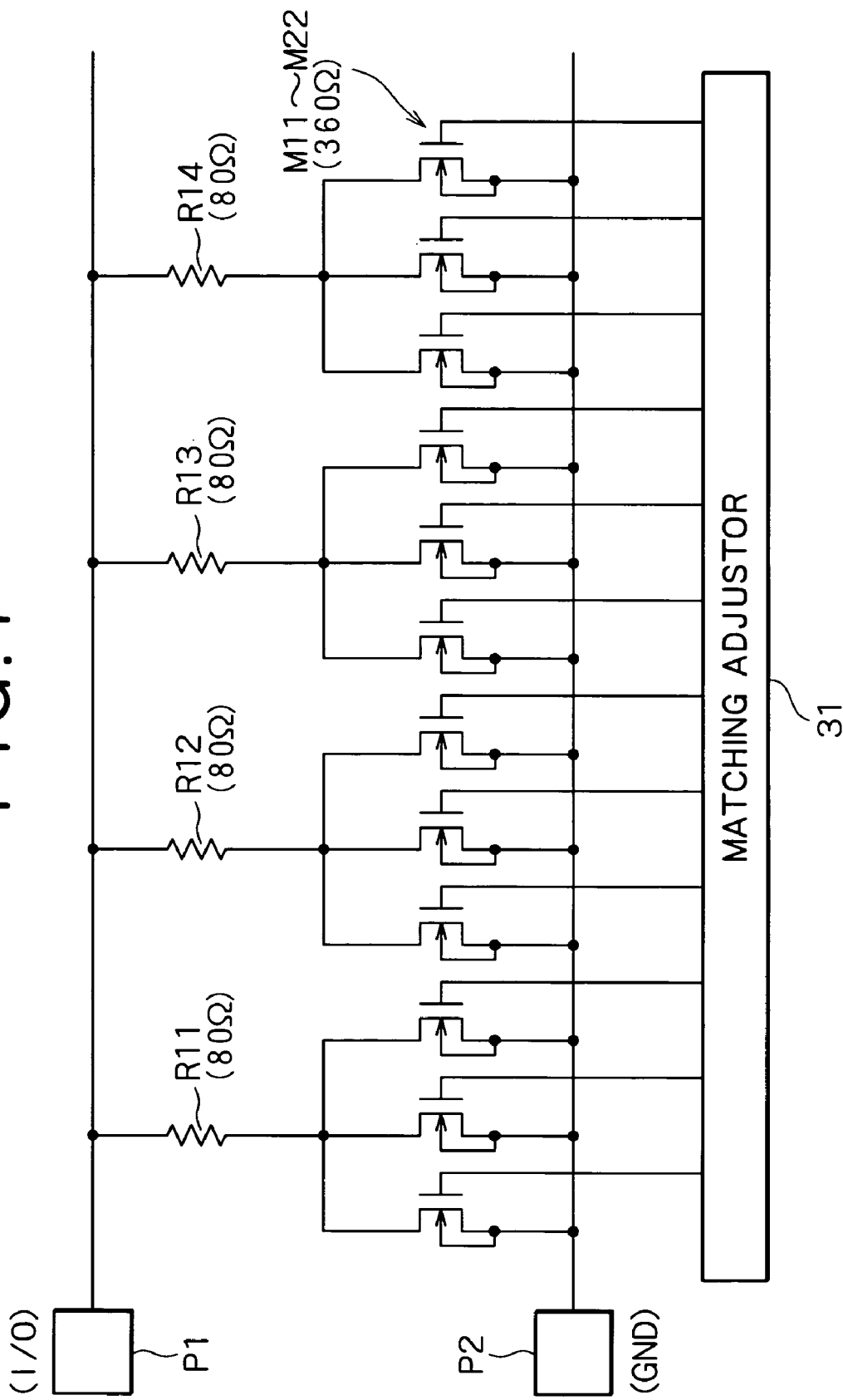
FIG. 7 is a circuit diagram showing a matching circuit of a third embodiment of the present invention.

Next, a semiconductor IC device according to a third embodiment of the present invention will be described. FIG. 7 is a circuit diagram showing a matching circuit according to the third embodiment. In the third embodiment, each three (m=3) MOS transistors M11 to M13, M14 to M16, M17 to M19, and M20 to M22 connected in parallel are connected in series to the four resistance elements R11 to R14, respectively, and each resistance element has a resistance of 80 Ω. In this matching circuit, a larger number of MOS transistors are connected to each of the resistance elements R11 to R14 (12 MOS transistors in total), so that the matching accuracy can be enhanced. At the same time, the ON-resistance of the MOS transistors M11 to M22 can be set to a larger value of 360 Ω, and the MOS transistors can be miniaturized. However, the layout area of the MOS transistors in the semiconductor IC device becomes larger as the number of MOS transistors increases. Therefore, a trade-off between miniaturization and the number of components should be considered, and the number of MOS transistors should be set so as to realize a favorable layout.

What is claimed is:

1. A semiconductor IC device in which an electrostatic protective circuit is connected to an internal circuit connected between two pads including a power-supply pad and a signal input/output pad, the internal circuit comprising a matching circuit for adjusting the impedance between the two pads, said matching circuit comprising:

n (n is a positive number of 2 or more) resistance elements connected in parallel between the two pads, the resistance of each of the resistance elements being set to a larger value than a required impedance between the two pads;

n×m (m is a positive number of 2 or more) transistors, wherein the m transistors in each set of m transistors are connected in parallel to each other, and wherein each said set of m transistors is connected in series to a respective one of the n resistance elements; and an adjustor for selectively allowing the transistors to perform an ON-operation, wherein the transistors comprise MOS transistors and the sources and drains thereof are connected in series to the resistance elements, respectively, wherein the n×m MOS transistors are laid out in the same diffusion-layer region, and wherein each of the m MOS transistors has a same gate width and the gate width satisfies the equations:

$$Wx \times Idg \times Rt + Vsp > Vesd;\text{ and}$$

$$Wx = W1 \times N,$$

where Wx is a total gate width of the MOS transistors performing a bipolar operation together when a surge current is applied, W1 is a gate width of each MOS transistor, N is the number of MOS transistors performing a bipolar operation (1≦N≦m), Idg is a value of breakdown current for the gate width of each MOS transistor, Rt is an electrical resistance of MOS transistor (total resistance in a path from a source pad to a drain pad of the MOS transistor), Vsp is a snapback voltage in the MOS transistor performing a bipolar operation, and Vesd is a maximum voltage required by an electrostatic protective circuit for dissipating a surge current.

2. A semiconductor IC device according to claim 1, wherein a protective transistor of the electrostatic protective circuit comprises a MOS transistor and the following equation is satisfied:

$$Wx \times Rt > Wesd \times Resd$$

where Wesd is a gate width of a MOS transistor in the electrostatic protective circuit (total gate width of a plurality of MOS transistors connected in parallel that are connected in parallel to a ballast resistor), and Resd is a resistance of the ballast resistor.

3. A semiconductor IC device according to claim 2, where N=1, so that Wx=W1.

4. A semiconductor IC device in which an electrostatic protective circuit is connected to an internal circuit connected between two pads including a power-supply pad and a signal input/output pad, the internal circuit comprising a matching circuit for adjusting the impedance between the two pads, said matching circuit comprising:

n (n is a positive number of 2 or more) resistance elements connected in parallel between the two pads, the resistance of each of the resistance elements being set to a larger value than a required impedance between the two pads;

n×m (m is a positive number of 2 or more) transistors, wherein the m transistors in each set of m transistors are connected in parallel to each other, and wherein each said set of m transistors is connected in series to a respective one of the n resistance elements; and an adjustor for selectively allowing the transistors to perform an ON-operation, wherein the transistors comp rise MOS transistors and the sources and drains thereof are connected in series to the resistance elements, respectively, wherein the n×m MOS transistors are laid out in the same diffusion-layer region, and wherein each of the m MOS transistors has a same gate width and the gate width satisfies the equation:

$$m \times W1 \times Idg \times Rt + Vsp > Vesd$$

where W1 is a gate width of each MOS transistor,

Idg is a value of breakdown current for the gate width of each MOS transistor,

Rt is an electrical resistance of the MOS transistor (total resistance in a path from a source pad to a drain pad of the MOS transistor), Vsp is a snapback voltage in the MOS transistor performing a bipolar operation, and Vesd is a maximum voltage required by an electrostatic protective circuit for dissipating a surge current.

5. A semiconductor IC device in which an electrostatic protective circuit is connected to an internal circuit connected between two pads including a power-supply pad and a signal input/output pad, the internal circuit comprising a matching circuit for adjusting the impedance between the two pads, said matching circuit comprising:

n (n is a positive number of 2 or more) resistance elements connected in parallel between the two pads, the resistance of each of the resistance elements being set to a larger value than a required impedance between the two pads;

n×m (m is a positive number of 2 or more) transistors, wherein the m transistors in each set of m transistors are connected in parallel to each other, and wherein each said set of m transistors is connected in series to a respective one of the n resistance elements; and an adjustor for selectively allowing the transistors to perform an ON-operation, wherein the transistors comprise MOS transistors and the sources and drains thereof are connected in series to the resistance elements, respectively, wherein the n×m MOS transistors are laid out in the same diffusion-layer region, and wherein a ballast resistor and a protective transistor are connected in series in the electrostatic protective device.

* * * * *